(12) United States Patent
Camiolo et al.

(10) Patent No.: US 11,703,901 B2
(45) Date of Patent: Jul. 18, 2023

(54) DEVICE FOR PROVIDING A POWER SUPPLY

(71) Applicants: STMicroelectronics (Grenoble 2) SAS, Grenoble (FR); STMicroelectronics (Alps) SAS, Grenoble (FR)

(72) Inventors: Jean Camiolo, St Egreve (FR); Alexandre Pons, Vizille (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 17/737,692

(22) Filed: May 5, 2022

(65) Prior Publication Data

US 2022/0261024 A1 Aug. 18, 2022

Related U.S. Application Data

(62) Division of application No. 16/787,679, filed on Feb. 11, 2020, now Pat. No. 11,353,905.

(30) Foreign Application Priority Data

Feb. 12, 2019 (FR) ...................................... 1901411

(51) Int. Cl.
*G05F 1/575* (2006.01)
*G01R 19/165* (2006.01)
(Continued)

(52) U.S. Cl.
CPC ....... *G05F 1/575* (2013.01); *G01R 19/16528* (2013.01); *G05F 1/56* (2013.01);
(Continued)

(58) Field of Classification Search
CPC . G05F 1/575; G05F 3/185; G05F 1/56; G01R 19/16528; G06F 1/266; H03F 3/45076; H03K 3/02337
See application file for complete search history.

(56) References Cited

U.S. PATENT DOCUMENTS 6,031,362 A * 2/2000 Bradley ............ H02M 3/33561
323/267
2009/0115379 A1 5/2009 Al-Shyoukh
(Continued)

FOREIGN PATENT DOCUMENTS

CN 102854908 A 1/2013
CN 104881072 A 9/2015
(Continued)

OTHER PUBLICATIONS

First Office Action and Search Report for co-pending CN Appl. No. 202010080066.1 dated Jul. 1, 2021 (8 pages).
(Continued)

*Primary Examiner* — Jung Kim
(74) *Attorney, Agent, or Firm* — Crowe & Dunlevy (57) ABSTRACT

A first terminal receives a first DC voltage. A switch selectively couples the first terminal to a second terminal providing an output. A control circuit selectively actuates the switch in response to a comparison of the first DC voltage to a second DC voltage. A low-dropout (LDO) linear voltage regulator, connected between the first and third terminals, operates to provide the second DC voltage from the first DC voltage.

9 Claims, 4 Drawing Sheets

(51) Int. Cl.
  *G05F 3/18* (2006.01)
  *G06F 1/26* (2006.01)
  *H03F 3/45* (2006.01)
  *H03K 3/0233* (2006.01)
  *G05F 1/56* (2006.01)

(52) U.S. Cl.
  CPC .............. *G05F 3/185* (2013.01); *G06F 1/266* (2013.01); *H03F 3/45076* (2013.01); *H03K 3/02337* (2013.01)

(56) References Cited

U.S. PATENT DOCUMENTS

2009/0273327 A1  11/2009  Ito et al.
2015/0100812 A1   4/2015  Jing et al.

FOREIGN PATENT DOCUMENTS

| CN | 105408829 A | 3/2016 |
| CN | 105793798 A | 7/2016 |
| CN | 107977037 A | 5/2018 |
| CN | 212341755 U | 1/2021 |
| JP | 2013027102 A | 2/2013 |
| WO | 2018009747 A2 | 1/2018 |

OTHER PUBLICATIONS

INPI Search Report and Written Opinion for FR 1901411 dated Dec. 3, 2019 (8 pages).

\* cited by examiner

DEVICE FOR PROVIDING A POWER SUPPLY

CROSS REFERENCE TO RELATED APPLICATIONS

This application is a divisional of U.S. patent application Ser. No. 16/787,679, filed Feb. 11, 2020, now U.S. Pat. No. 11,353,905, which claims the priority benefit of French Application for Patent No. 1901411, filed on Feb. 12, 2019, the contents of which are hereby incorporated by reference in their entireties to the maximum extent allowable by law.

TECHNICAL FIELD

The present application relates generally to devices for providing, from a power supply source, a power supply to a load. The application relates more specifically to the field of transmission cables for transmitting energy between a power supply source and a load, in particular cables and connectors of the USB-C type using USB-PD technology.

BACKGROUND

Although wireless is one of the major veins of research in the field of energy and data exchange, cables seem to still be the most reliable means for connecting a plurality of electronic devices, whether for exchanging data or for supplying power to or recharging one or more electronic devices.

Among the various types of cables and connectors of the Universal Serial Bus (USB) standard, the USB-C type is one of the types which makes the exchange of data and energy possible. USB-PD (from "POWER DELIVERY") technology is a recharging technology that is adapted to cables and connectors of the USB-C type. By means of this technology, it is possible to manage the power supply of electronic devices.

It would be desirable to be able to at least partly improve certain aspects of devices for providing, from a power source, a power supply to a load by way of a cable, in particular by way of a USB-C cable adapted to USB-PD technology.

SUMMARY

Embodiments herein address all or some of the drawbacks of known devices for providing, from a power source, a power supply to a load.

In an embodiment, a device comprises: a first terminal configured to receive a first DC voltage; a switch selectively coupling the first terminal to a second output terminal of the device; a control circuit of the switch comprising a third terminal configured to receive a second DC voltage; and a low-dropout (LDO) linear voltage regulator connected between the first and third terminals, the regulator being configured to provide the second voltage based on the first voltage.

According to an embodiment, the control circuit of the switch is configured to compare the first voltage with the second voltage, and to control the open or closed state of the switch as a function of the result of the comparison.

According to an embodiment, the control circuit of the switch comprises a hysteresis comparator, a first input of which is coupled to the first terminal, a second input of which is connected to the third terminal, and an output of which is coupled to a control terminal of the switch.

According to an embodiment, when the first voltage increases from a target value, the regulator is configured to keep the second voltage lower than or equal to a threshold voltage, preferably higher than the target value.

According to an embodiment, the threshold voltage is determined based on the target value.

According to an embodiment, the regulator comprises: a transistor, preferably a power transistor, the conduction terminals of which are respectively connected to the first and third terminals; a first circuit configured to control the transistor based on a signal available on a fourth terminal; and a second circuit configured to provide, to the fourth terminal, a signal representative of the difference between the value of the second voltage and the threshold value.

According to an embodiment, the second circuit comprises a differential amplifier having an input which, preferably non-inverting, is configured to receive a voltage representative of the threshold value, a further input which, preferably inverting, is linked to the third terminal, and an output of which is connected to the fourth terminal.

According to an embodiment, the device further comprises a third circuit configured to activate the second circuit when the second voltage becomes higher than a voltage limit.

According to an embodiment, the third circuit is configured to activate the differential amplifier of the second circuit when the second voltage is substantially higher than or equal to the voltage limit.

According to an embodiment, the device further comprises a starting circuit for starting the regulator, which is supplied by the first voltage.

According to an embodiment, the starting circuit is configured to provide, to the fourth terminal and while the second circuit is inactive, a signal such that the second voltage increases with the first voltage up to the voltage limit.

According to an embodiment, the signal provided to the fourth terminal by the starting circuit is representative of the difference between the second voltage and a reference voltage.

According to an embodiment, the starting circuit comprises a differential amplifier, preferably a low-power differential amplifier, having an input which, preferably non-inverting, is linked to a source of the reference voltage, a further input which, preferably inverting, is linked to the second terminal, and an output of which is connected to the fourth terminal, the differential amplifier being supplied by the first voltage.

According to an embodiment, the source of the reference voltage is supplied by the first voltage, the voltage source preferably comprising one or more diodes the one or more threshold voltages of which determine the reference voltage.

According to an embodiment, the first terminal and/or the control terminal of the switch are each linked to an application terminal for applying a reference potential, preferably ground, by a respective diode, preferably a Zener diode.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the management of a phase of negotiation between a device and a power supply source regarding the power supply level to be provided is not described in detail. Moreover, only the relevant aspects of USB-C and USB-PD technologies are described, the other aspects applying without modification. In particular, data exchange functions via a cable of the USB-PD type are not described, the described embodiments being compatible with the data exchange functions of conventional USB-PD cables.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
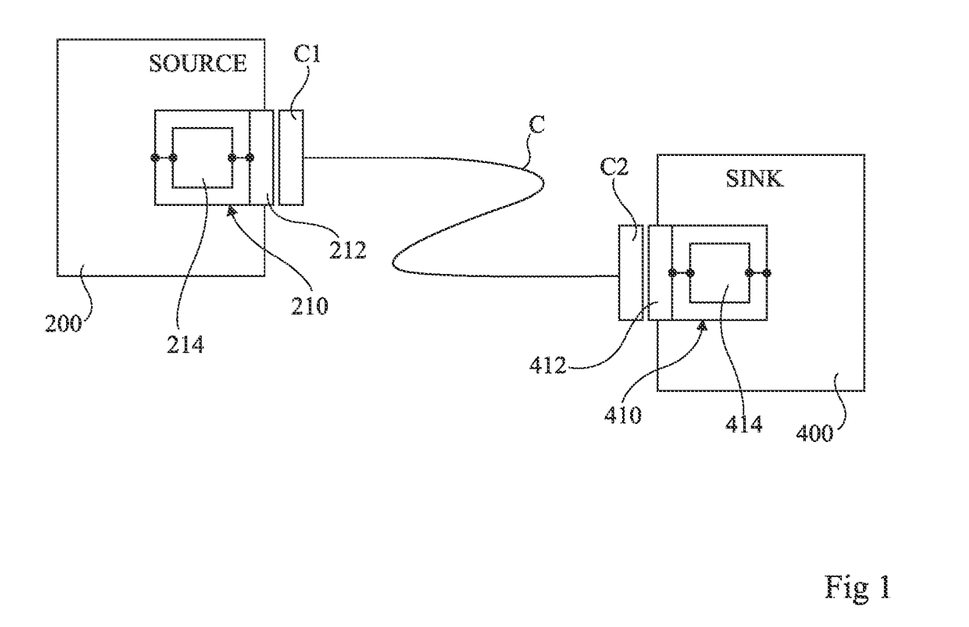
FIG. 1 is a schematic view depicting a connection between a power supply source and an electronic device.

FIG. 1 is a schematic view depicting a transmission of energy between a power supply source (SOURCE) 200 and an electronic device (SINK) 400 connected by way of a cable C, for example of the USB-C type equipped with USB-PD or USB Power Delivery technology. The power supply source 200 is, for example, the mains power supply or a DC power supply. The power supply source 200 can be a computer, a portable battery, etc., or any other electronic device adapted to supply a device with power and/or to recharge a battery.

The cable C comprises at each of its ends a connector C1, C2, in this example adapted to USB-PD technology. The connectors C1, C2 are generally identical.

The power supply source 200 or the device 400 respectively comprises a coupling element 210 or 410, which respectively comprises a connector 212 or 412, and a connection interface 214 or 414. Each connector 212, 412 is adapted to cooperate with a connector C1, C2 of the cable C. Each connection interface 214, 414 respectively couples the connector 212, 412 to the rest of the power supply source 200 or device 400. By means of the connection interfaces 214, 414, it is possible to adapt the power supply provided by the power supply source 200 as a function of the power supply required by the device 400. The interfaces 214, 414 are generally identical.

During a connection, a communication is established between the device 400 and the power supply source 200 in order to decide on the electric power supply level necessary for the device 400 to be able to be powered and/or recharged. More specifically, the device 400 indicates the minimum power level required for its operation and the power supply source 200 indicates the power supply levels that it is capable of providing. A negotiation, for example managed by USB-PD technology, is thus launched in order to define what power level the power supply source 200 will provide to the device 400. Once this negotiation has ended, the connection interface 214 adjusts the power supply level of the power supply source 200 in accordance with the result of the negotiation, then the power supplying of the device 400 begins. More specifically, the interface 214 comprises a power converter (not illustrated In FIG. 1), preferably a DC/DC or AC/DC voltage converter, controlled to adjust the power level of the source 200 in accordance with the result of the negotiation, i.e., to adjust the power level of the source to the negotiated power level.

For instance, the power supply levels the source 200 is capable of providing are selected from a list of power supply levels saved in the interface. Preferably, this list is predefined, for example by a standard. Each power supply level of this list is characterized by a plurality of values, in particular by the value of the voltage corresponding to this power level.

Nevertheless, the power level available at the output of the power converter can be higher than the negotiated power level. In particular, the voltage delivered by the converter can be higher than the voltage characterizing the negotiated power supply level, the voltage characterizing the negotiated power supply level constituting a target value of the voltage available as the output of the converter. This can lead to a damaging of the device 400. In order to address this damaging of the device 400, in the described embodiments, an electric isolation of the connector C1 from the output of the power converter is provided when the voltage that it delivers departs from the target value and exceeds a threshold voltage. When a strength of power supply has been negotiated, the value of the threshold voltage is preferably determined based on the value of the voltage corresponding to this negotiated strength, i.e. based on the target value of the voltage delivered by the converter. As long as a strength has not been negotiated, the value of the threshold voltage is preferably determined by the lowest voltage characterizing the strengths of power supply of the list saved in the interface 214, this lowest voltage constituting, here as well, a target value of the voltage delivered by the converter. For instance, this lowest voltage is defined by a standard and is, for example, equal to 5 V.

In the described embodiments, the electric isolation between the connector C1 and the power converter, when the voltage that it delivers exceeds the threshold voltage, is implemented by electronic components of the interface 214 which are supplied with the voltage delivered by the power converter. In these embodiments, a protection of these components against an increase in the voltage delivered by the power converter likely to damage these components is provided. By this means, it is possible to avoid that these components are destroyed during such a voltage increase and can thus no longer control the electric isolation between the power adjustment device and the connector C1.

Figure 2:
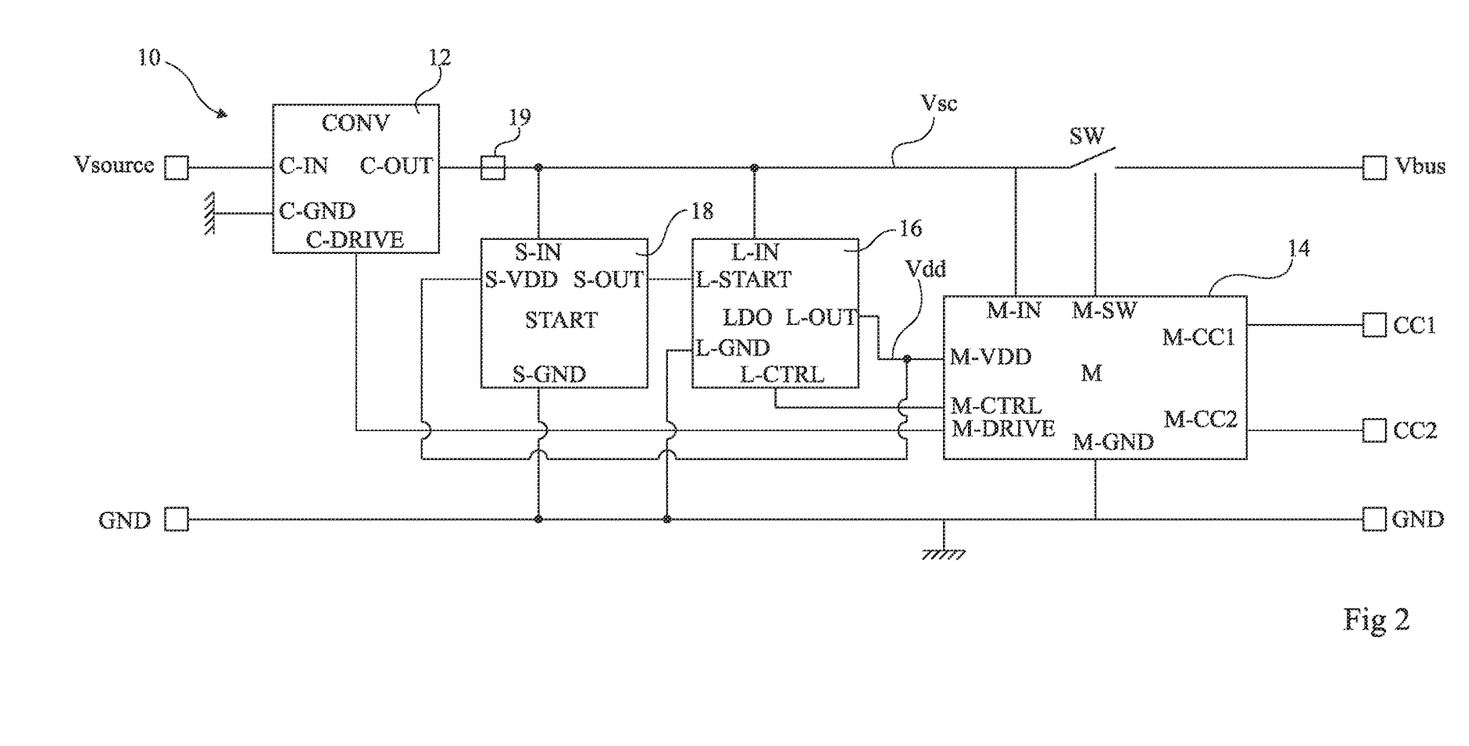
FIG. 2 is a schematic view depicting an embodiment of an electronic device for providing an electric power supply to the electronic device shown in FIG. 1.

FIG. 2 is a schematic view depicting an embodiment of an electronic device 10 comprised in the interface 214, 414 of the source 200 and of the device 400 shown in FIG. 1. More specifically, a device 10 is positioned in each connection interface of the electronic devices coupled by the cable C, however, this device 10 is only active in the connection interface of the device playing the role of the power supply source, and, in the case depicted in FIG. 1, only the device 10 of the connection interface 214 is active. Thus, although the device 10 is described here in relation to the interface 214 of the source 200 and the connector C1, what is indicated also applies to the device 10 of the interface 414.

The device 10 comprises at least two input terminals connected to a power supply source, here the rest of the power supply source 200. A first terminal receives a voltage Vsource from the power supply source 200, referenced with respect to a reference potential GND, for example ground, received by a second terminal. The device 10 further comprises a first output terminal providing a power supply voltage Vbus, referenced with respect to the reference potential GND received by a second output terminal, and at least one communication terminal. These output terminals are all configured to be coupled to the connector C1, which then enables the coupling with the device 400, via the connector C2 and the interface 414 of the device 400. In this embodiment, the device 10 comprises two communication terminals CC1, CC2. An advantage of having two communication terminals is that, in cases where these terminals are positioned in a symmetrical manner on the connector C1, it is possible by this means to manufacture reversible connectors, i.e. connectors, for example rectangular in shape, that can be plugged in in a first direction and in a second direction opposite to the first.

The device 10 comprises a converter (CONV) 12, a switch SW, a control circuit or module (M) 14 of the switch SW, a linear voltage regulator (LDO) 16, preferably a low-dropout linear regulator, and, in this embodiment, a starting circuit (START) 18 of the regulator 16.

The converter 12 is, for example, a buck converter adapted to convert a DC voltage Vsource into a lower DC power supply voltage Vsc, for example when the power supply source 200 is a DC power supply source, for example an electronic device adapted to power and/or recharge a further electronic device, such as a computer or an external battery. The converter 12 comprises: an input terminal C-IN that receives the voltage Vsource; a terminal C-GND that receives the reference potential GND; a control terminal C-DRIVE that receives a control signal representative of the target value of the voltage Vsc; and an output terminal C-OUT that provides, from an electric power supply of the source 200, a converted or adjusted voltage Vsc to a terminal or node 19 of the device 10, the terminal C-OUT being connected to the terminal 19.

In a variant embodiment not shown, the converter 12 is external to the device 10. In this case, the terminal 19 constitutes the input of the device 10 configured to receive the voltage Vsc.

The switch SW has one of its conduction terminals coupled to the terminal 19, and its other conduction terminal is connected to the output terminal providing the voltage Vbus. The switch SW is controlled, or driven, by the control module 14. When the switch SW is open, the output terminal C-OUT of the converter, thus the terminal 19, is isolated electrically from the output terminal of the device 10 that provides the voltage Vbus.

The control module 14 is configured to observe the voltage Vsc and control the opening of the switch SW when the voltage Vsc exceeds a threshold voltage. The control module 14 comprises: an input terminal M-IN that receives the voltage Vsc, or at least a voltage substantially equal to the voltage Vsc, the voltage Vsc being referenced with respect to the reference potential GND; a terminal M-GND that receives the reference potential GND; at least one communication terminal coupled to the communication terminal of the device 10 (in the case depicted in FIG. 2, the control module 14 comprises two communication terminals M-CC1, M-CC2); a control terminal M-DRIVE of the converter 12, which transmits a control signal to the terminal C-DRIVE of the converter 12, the control signal being representative of the target value of the voltage Vsc provided by the converter 12; a control terminal M-CTRL of the regulator 16, which transmits a control signal to the regulator 16 representative of the target value of the voltage Vsc; a control terminal M-SW of the switch SW that transmits a control signal to the switch SW; and a terminal M-VDD that receives an output voltage Vdd from the regulator 16, this voltage permitting in particular to electrically supply the module 14.

The voltage regulator 16 is configured to provide, based on the voltage Vsc, the voltage Vdd to the terminal M-VDD of the module 14. More specifically, after a starting phase, the regulator 16 is configured to provide a regulated voltage Vdd equal to the threshold voltage, this threshold voltage being determined based on the target value of the voltage Vsc. Preferably, the threshold voltage is proportional to and higher than the target value of the voltage Vsc, so that the voltage Vdd is substantially equal to the voltage Vsc if the voltage Vsc is lower than or equal to the threshold voltage and is otherwise equal to the threshold voltage. The voltage regulator comprises: a terminal L-IN that receives the voltage Vsc; a terminal L-GND that receives the reference potential GND; a terminal L-OUT that provides the voltage Vdd; a terminal L-CTRL connected to the terminal M-CTRL of the module 14 for receiving the corresponding control signal; and in this embodiment, a terminal L-START that receives a starting signal provided by the starting circuit 18.

In this embodiment, the starting circuit 16 is configured to start the regulator 16, or, in other words, to control the regulator 16 during a starting phase so that it provides a non-zero voltage Vdd to the terminal M-VDD. More specifically, during the starting phase, the circuit 18 controls the regulator 16 so that the voltage Vdd does not exceed a voltage limit. The starting circuit 18 comprises: a terminal S-IN that receives the voltage Vsc, or at least a voltage substantially equal to the voltage Vsc, the terminal S-IN being coupled to the terminal C-OUT, thus to the terminal 19; a terminal S-GND that receives the reference potential GND; a terminal S-OUT that provides a starting signal to the terminal L-START of the regulator 16; and a terminal S-VDD that receives a voltage representative of the voltage Vdd, the terminal S-VDD receiving the voltage Vdd in the example shown in FIG. 2.

In a variant embodiment not depicted, the circuit 18 is part of the regulator 16.

An embodiment, by means of the device 10, of a method for supplying power to a device 400 will now be described in relation to FIG. 3.

Figure 3:
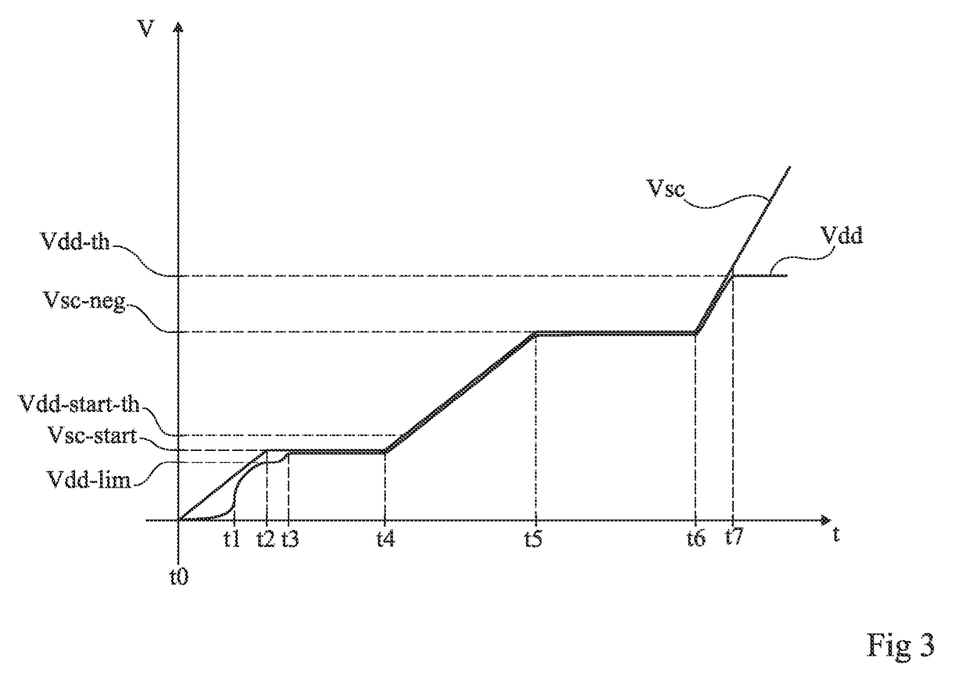
FIG. 3 depicts the progression of voltages in the device shown in FIG. 2.

FIG. 3 depicts the progression, as a function of time t, of the voltages Vsc and Vdd, in volts V, in the interface 214.

Between instants t0 and t2, the instant t0 marking the beginning of a starting phase, the voltage Vsc increases from a zero value. At an instant t1 comprised between the instants t0 and t2, the non-zero voltage Vsc present on the terminal S-IN causes the provision, by the circuit 18, of a starting signal to the regulator 16. The regulator 16 thus provides a non-zero voltage Vdd to the terminal M-VDD, the voltage Vdd increasing with the voltage Vsc from the instant t1. As soon as the voltage Vdd is sufficient for supplying the module 14, for example between the instants t1 and t2, the module 14 controls the converter 12 so that it provides a voltage Vsc at a target value Vsc-start, for example the lowest voltage value Vsc characterizing the power supply levels of the list saved in the interface 214, for example 5 V. In the example shown in FIG. 3, the voltage Vsc stabilizes at the target value Vsc-start from the instant t2.

Moreover, during the starting phase, as soon as the circuit 18 provides the starting signal to the regulator 16 (instant t1), the regulator 16 is controlled by this signal so that the voltage Vdd does not exceed a limit value Vdd-lim. In the example shown in FIG. 3, the voltage Vdd stabilizes at the value Vdd-lim at the instant t2. The value Vdd-lim is lower than the target value Vsc-start, for example equal to 4 V. The value Vdd-lim is such that the module 14 is correctly supplied. In other words, the value Vdd-lim is higher than or equal to the minimum power supply voltage of the module 14.

In addition, during the starting phase, between the instant t0 and an instant t3 later than the instant t2 or at the same time as the instant t2, the switch SW is kept open by the module 14. For instance, as long as the voltage Vdd is lower than the minimum power supply voltage of the module 14, the module 14 is not able to generate a control signal with a level of voltage sufficient for closing the switch SW, and, when the voltage Vdd becomes higher than or equal to the minimum power supply voltage of the module 14, the latter maintains the voltage level of the control signal of the switch SW at a value such that the switch SW remains open.

From the instant t3 that marks the end of the starting phase, the regulator is no longer controlled by the starting circuit 18, but by the control signal that the module 14 provides for it. The regulator 16 thus provides a voltage Vdd that is lower than a threshold voltage Vdd-start-th. The voltage Vdd-start-th is determined by the target value Vsc-start, based on the control signal provided by the module 14 to the regulator 16. The value of the threshold voltage Vdd-start-th is greater than the target value Vsc-start. Preferably, the value of the threshold voltage Vdd-start-th is proportional to the target value Vsc-start.

Thus, from the instant t3, the voltage Vdd is equal, ignoring the voltage drop in the regulator 16, to the voltage Vsc if the voltage Vsc is lower than or equal to the threshold voltage Vdd-start-th, and otherwise to the voltage Vdd-start-th.

Moreover, from the instant t3, the module 14 closes the switch SW and is configured to open the switch if the voltage Vsc becomes higher than the voltage Vdd plus a hysteresis value.

From the instant t3, a phase of negotiation of a power supply that the source 200 will provide to the device 400 is implemented.

During this phase of negotiation, between the instant t3 and a later instant t4 in FIG. 3, the device 400 sends to the power supply source 200, by way of the communication terminals CC1, CC2 and the cable C, information regarding the necessary power supply level to be provided to it. The control module 14, for its part, provides to the device 400, by way of the communication terminals CC1, CC2 and the cable C, the power supply levels that the power supply source 200 is capable of providing to the device 400. The control module 14 then negotiates with the device 400, by way of the communication terminals CC1, CC2, in order to choose one of these power supply levels.

For instance, the module 14 determines the power levels that the source 200 is capable of providing based on measurements of the voltage Vsource and/or Vsc, and the list of power supply levels saved in the interface. Each of the levels of the list is defined by a plurality of values, for example the power supply current, the power supply voltage, the minimum power supply current, the minimum power supply voltage, etc. For instance, the module 14 determines, from this list, the power supply levels that the source 200 is able to provide by comparing the measured voltage Vsource and/or Vsc with each minimum power supply voltage of the power levels from the list.

According to a further example, the module 14 determines the power levels that the source 200 is capable of providing solely based on the list of power supply levels saved in the interface. It is then considered that the source 200 is capable of providing each of the power levels of the list.

At the instant t4, the module 14 updates the control signal sent to the terminal C-DRIVE of the converter 12, so that the converter provides a voltage Vsc having a value Vsc-neg associated with the chosen or negotiated power supply level. The value Vsc-neg thus constitutes the new target value of the voltage Vsc.

At the instant t4, the module 14 also updates the control signal sent to the terminal L-CTRL of the regulator 16, this signal being representative of the target Vsc-neg. The regulator 16 thus provides a voltage Vdd lower than a threshold voltage Vdd-th, determined by the target value Vsc-neg, based on the control signal provided by the module 14 to the regulator 16. The value of the threshold voltage Vdd-th is greater than the target value Vsc-neg. Preferably, the value of the threshold voltage Vdd-th is proportional to the target value Vsc-neg.

Thus, from the instant t4, the voltage Vdd is equal, ignoring the voltage drop in the regulator 16, to the voltage Vsc if the voltage Vsc is lower than or equal to the threshold voltage Vdd-th, and otherwise to the voltage Vdd-th.

In the example shown in FIG. 3, the target value Vsc-neg is greater than the target value Vsc-start, for example equal to 20 V. Thus, from the instant t4 to a later instant t5, the voltages Vsc and Vdd increase until they are equal to the target value Vsc-neg. At the instant t5, the value of the voltage Vsc is equal to the target value Vsc-neg, and the voltage Vdd is equal to the voltage Vsc, ignoring the voltage drop in the regulator 16. From the instant t5, the device 400 is thus supplied, via the cable C, by the voltage Vsc at the target value Vsc-neg corresponding to the negotiated strength.

At an instant t6 later than the instant t5, the voltage Vsc increases without the target value Vsc-neg having been modified, for example due to a defect in the operation of the converter 12. As long as the voltage Vsc is lower than the threshold voltage Vdd-th, the voltage Vdd is equal to the voltage Vsc, ignoring the voltage drop in the regulator 16. From an instant t7 later than the instant t6, the voltage Vsc is higher than the threshold voltage Vdd-th and the voltage Vdd thus stabilizes at a value equal to that of the threshold voltage Vdd-th.

Thus, even if the voltage Vsc increases up to values capable of damaging the electronic components of the module 14, the power supply voltage Vdd received by the module 14 remains lower than or equal to the threshold voltage Vdd-th, the value of the voltage Vdd-th being determined so as not to damage the module 14. Moreover, although not illustrated in FIG. 3, a passive protective device for protecting against overvoltages, comprising, for example, one or more diodes, is preferably provided at the terminal M-IN of the module 14, preferably between the terminal M-IN and a terminal at the reference potential GND. Thus, when the voltage Vsc exceeds the trigger threshold of the protective device, the voltage present on the terminal M-IN of the module 14 is limited by the passive protective device for protecting against overvoltages, which it makes it possible to prevent a voltage Vsc likely to damage the module 14 from being present on the terminal M-IN.

Moreover, shortly after the instant t7, the module 14 detects that the voltage Vsc is higher than the voltage Vdd plus the hysteresis value, i.e. that the voltage Vsc here is higher than the threshold voltage Vdd-th plus the hysteresis value. The module 14 thus controls the opening of the switch SW, which makes it possible to protect the device 400 against the increase in the voltage Vsc beyond the threshold voltage Vdd-th.

Although not depicted in FIG. 3, if, between the instants t0 and t3, the voltage Vsc increases, for example due to a defect in the operation of the converter 12, up to values higher than the target value Vsc-start, the voltage Vdd received by the module 14 remains lower than or equal to the voltage limit Vdd-lim. By this means, it is possible to protect the module 14 against increases in the voltage Vsc which would be likely to damage the module 14. The device 400 is, for its part, protected against these increases in the voltage Vsc by the fact that the switch SW is open.

Although not depicted in FIG. 3 either, if such an increase in the voltage Vsc occurs between the instants t3 and t4, the module 14 is protected since the voltage Vdd that it receives remains lower than or equal to the threshold voltage Vdd-start-th. The device 400 is, for its part, protected by the opening of the switch SW controlled by the module 14. Indeed, the module 14 opens the switch SW when the voltage Vsc becomes higher than the voltage Vdd raised by the hysteresis value, i.e., here if the voltage Vcs becomes higher than the threshold voltage Vdd-start-th plus the hysteresis value. Thus, the voltage provided to the device 400 cannot exceed Vdd-start-th. It will be noted that the device 10 has a similar operation between the instants t3 and t4 and from the instant t4. More specifically, between the instants t3 and t4, the target value of the voltage Vsc is Vsc-start, the threshold voltage thus being Vdd-start-th and being determined by the value Vsc-start, while, from the instant t4, the target value of the voltage Vsc is Vsc-neg, the threshold voltage thus being Vdd-th and being determined by the value Vsc-neg.

Figure 4:
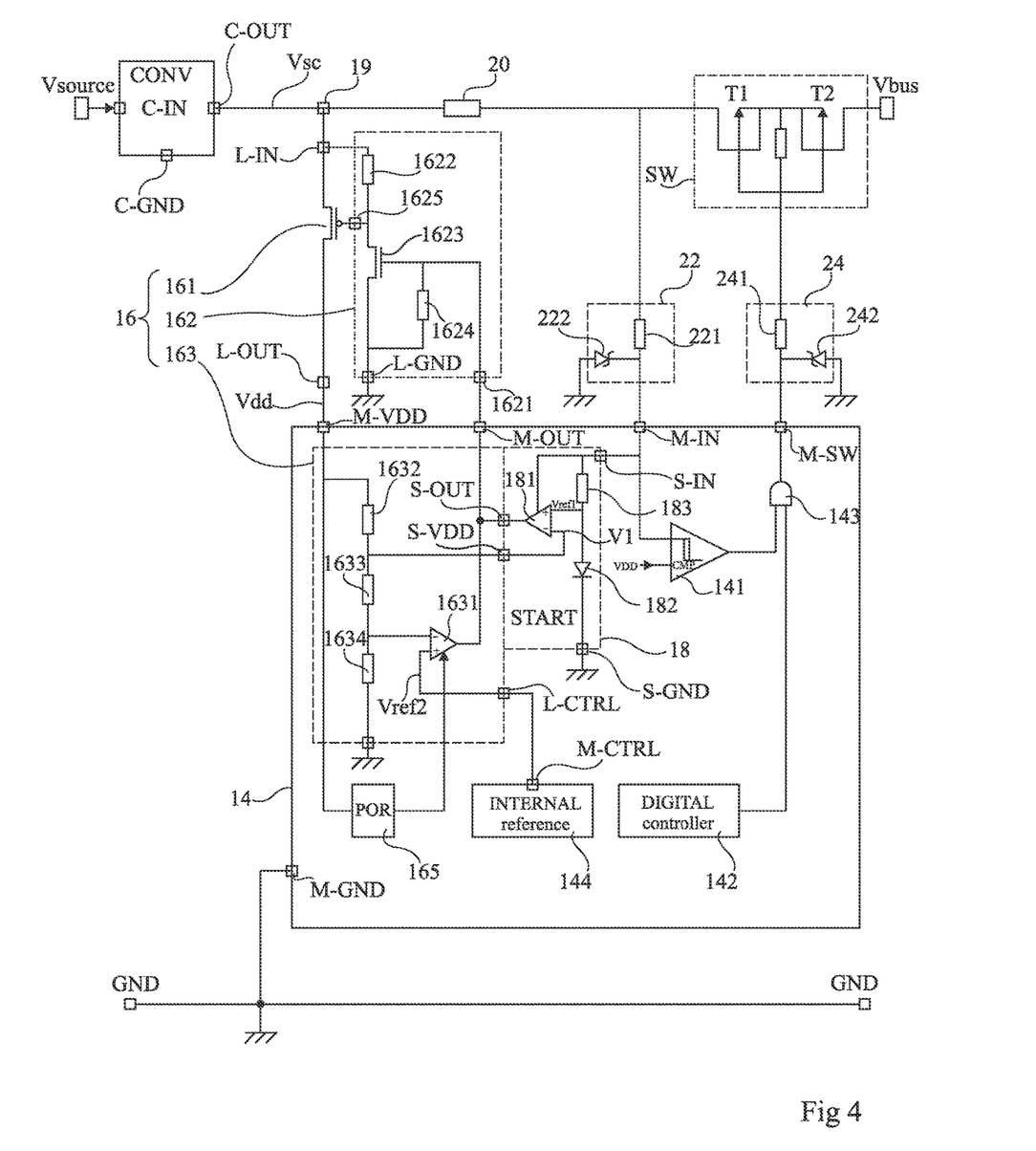
FIG. 4 depicts, in a more detailed manner and in the form of an electronic circuit, an embodiment of the device shown in FIG. 2.

FIG. 4 depicts, in a more detailed manner and in the form of an electronic circuit, an embodiment of the device 10 shown in FIG. 2.

In the example shown in FIG. 4, the terminal M-IN of the module 14 is coupled to the terminal C-OUT, thus to the terminal 19, by a resistor 20 in series with a passive protective device 22 for protecting against overvoltages, the resistor 20 being connected to the terminal C-OUT. The device 22 here comprises a resistor 221 connected between the resistor 20 and the terminal M-IN, and a Zener diode 222 the anode of which is connected to a terminal at the reference potential GND and the cathode of which is connected to the terminal M-IN.

In the example shown in FIG. 4, the switch SW comprises two transistors T1 and T2 in series, coupling the terminal C-OUT of the converter 12 (thus the terminal 19) to the output terminal of the device 10 that provides the voltage Vbus, the transistor T1 being on the side of the terminal C-OUT. More specifically, a conduction terminal of the transistor T1 is connected to the connection node between the resistor 20 and the device 22. The transistors T1 and T2 here are P-channel MOS transistors, the source and the gate of the transistor T1 being coupled, preferably connected, respectively to the source and to the gate of the transistor T2. The switch SW further comprises a resistor R that couples the sources of the transistors T1 and T2 to the gates of the transistors T1 and T2. The gates of the transistors T1 and T2 constitute the control terminal of the switch SW. The control terminal of the switch SW is coupled to the M-SW terminal of the module 14, in this example by a passive protective device 24 for protecting against overvoltages. The device 24 is, for example, identical to the device 22, the diode and the resistor of the device 24 being respectively referenced 242 and 241.

In FIG. 4, the regulator 16 comprises a transistor 161, for example a P-channel, MOS transistor, the conduction terminals of which are respectively connected to the terminals L-IN and L-OUT. During operation, the transistor 161 is controlled so as to implement the method described in relation to FIG. 3. Preferably, the transistor 161 is a power transistor.

The regulator 16 further comprises a control or driver circuit 162 of the transistor 161. The circuit 162 is configured to provide a control signal to the control terminal of the transistor 161, determined on the basis of a signal received on a terminal 1621 of the circuit 162. The circuit 162 comprises a resistor 1622 and a transistor 1623 connected in series between the terminal L-IN (thus the terminal 19) and the terminal L-GND. A resistor 1624 is connected between the control terminal of the transistor 1622, here the terminal 1621, and the terminal L-GND. The connection node 1625 between the transistor 1623 and the resistor 1622 is connected to the control terminal of the transistor 161. In this example in which the transistor 161 is P-channel, the transistor 1623 is N-channel and has its source and its drain connected respectively to the terminal L-GND and to the resistor 1622.

The regulator 16 further comprises a circuit 163 configured to provide, to the terminal 1621 of the circuit 162, a signal representative of the difference between the voltage Vdd and the threshold voltage Vdd-th if a power supply level has already been negotiated, or otherwise between the voltage Vdd and the threshold voltage Vdd-start-th. This signal is provided by the output of a differential amplifier 1631. The output of the amplifier 1631 is connected to the terminal 1621. In the example shown in FIG. 4, the circuit 163 is included in the module 14 and the output of the amplifier 1631 constitutes an output terminal M-OUT of the module 14, connected to the terminal 1621 of the circuit 162. As a variant, the circuit 163 is external to the module 14.

An input, preferably non-inverting (+), of the amplifier 1631 is configured to receive a reference voltage Vref2 representative of the target Vsc-neg or Vsc-start depending on the case, thus of the threshold voltage Vdd-th or Vdd-start-th depending on the case. The voltage Vref2 is provided by a circuit 144 (INTERNAL reference) of the module 14. In this example in which the circuit 163 is part of the module 14, the terminal of the circuit 144 that provides the voltage Vref2 corresponds to the terminal M-CTRL described in relation to FIG. 2, and the input of the amplifier 1631 that receives the voltage Vref2 corresponds to the terminal L-CTRL described in relation to FIG. 2. For instance, the voltage Vref2 is equal to a fraction of the target value of the voltage Vsc, or in other words, is equal to A*Vsc-start or A*Vsc-neg depending on the case, A being less than 1.

A further input of the amplifier 1631, preferably inverting (−), is coupled to the terminal M-VDD for receiving a voltage V2 representative of the voltage Vdd. More specifically, the circuit 163 comprises a voltage-dividing resistor bridge. The divider bridge here comprises three resistors 1632, 1633 and 1634 connected in series between the terminal M-VDD (L-OUT) and a terminal at the reference potential GND, the resistor 1632 being connected to the terminal M-VDD and the resistor 1634 being connected to the terminal at the potential GND. The voltage V2 is available at the connection node between the resistors 1633 and 1634.

In this embodiment, the amplifier 1631 further comprises an activation terminal that receives an activation signal from a circuit 165 (POR) of the module 14. The POR ("power on reset") circuit 165 is further connected to the terminal M-VDD. The circuit 165 is configured to provide an activation signal to the activation terminal of the amplifier 1631 when the voltage Vdd is substantially equal, preferably equal, or higher than the voltage Vdd-lim. Thus, the circuit 163 is only active from the instant t2 shown in FIG. 3.

Although the circuit 165 is illustrated here as being part of the module 14, this circuit 165 can be external to the module 14. In particular, in cases where the circuit 163 is external to the module 14, the circuit 165 can be part of the circuit 163, thus of the regulator 16.

In the example shown in FIG. 4, the starting circuit 18 comprises a differential amplifier 181. A power supply terminal of the amplifier 181 is connected to the terminal S-IN of the circuit 18, which is itself connected to the terminal M-IN of the module 14. Thus, the amplifier 181 is supplied by a voltage substantially equal to the voltage Vsc. Preferably, the differential amplifier 181 is a low-power amplifier, i.e., it can operate with a relatively low power supply level, for example with a power supply current in the order of a few microamperes, for example less than 10 μA, and a power supply voltage in the order of 2 to 3 V. The output of the amplifier 181 constitutes the output S-OUT of the circuit 18. The output S-OUT of the circuit 18 is connected to the terminal M-OUT, thus to the terminal 1621 of the circuit 161 which corresponds to the terminal L-START in FIG. 2. An input of the amplifier 181, preferably the non-inverting (+) input, receives a reference voltage Vref1. The voltage Vref1 does not need to be precise and is only necessary during the starting phase of the circuit 10. For example, the voltage Vref1 is set by the drop in voltage at the terminals of a component, for example by the threshold voltage of one or more diodes in series or by one or more MOS transistors in series. In the example shown in FIG. 4, the voltage Vref1 is set by the threshold voltage of a diode 182. The diode 182 is connected in series with a resistor 183, between the terminals S-IN and S-GND, the cathode of the diode being connected to the terminal S-GND and the connection node between the diode 182 and the resistor 183 providing the voltage Vref1. A further input of the amplifier 181, preferably inverting (−), is linked to the terminal M-VDD for receiving a voltage V1 representative of the voltage Vdd. This further input of the amplifier 181 thus corresponds to the terminal S-VDD shown in FIG. 2.

In this example, the voltage V1 is available at the connection node between the resistors 1632 and 1633. The circuit 163 of the regulator 16 thus shares its voltage divider bridge with the circuit 18. As a variant, an additional divider bridge can be provided between the terminal S-VDD and the input of the amplifier that receives the voltage V1, the terminal S-VDD thus being connected to the terminal M-VDD as illustrated in FIG. 2.

In this example, the circuit 18 is part of the module 14. As a variant, the circuit 18 can be external to the module 14.

In FIG. 4, the module 14 further comprises a hysteresis comparator 141. One input of the comparator is connected to the terminal M-IN, the other input of the comparator being connected to the terminal M-VDD (not illustrated in FIG. 4) for receiving the voltage Vdd. The output of the comparator 141 is coupled to the terminal M-SW.

In the illustrated embodiment, the module 14 comprises a control circuit 142 (Digital Controller) for controlling the switch SW. The output of the circuit 142 is coupled to the terminal M-SW. In this example, the module 14 comprises an AND gate 143 the inputs of which are connected to the respective outputs of the comparator 141 and of the circuit 142, and the output of which is connected to the terminal M-SW.

It will be noted that, in FIG. 4, the terminal C-DRIVE of the converter 12, the terminal M-DRIVE of the module 14, the communication terminals M-CC1 and M-CC2 of the module 14 and the communication terminals M-CC1 and M-CC2 of the device 10 have not been illustrated.

During a starting phase of the device 10 shown in FIG. 4, when the voltage Vsc increases from a zero value (from the instant t0 and until the instant t1 in FIG. 3), a non-zero voltage is established on the terminal M-IN. As soon as this voltage is sufficient for supplying the amplifier 181 and for setting the voltage Vref1, since the voltage Vdd, thus the voltage V1, are zero, the output voltage of the amplifier 181 is non-zero. This non-zero voltage is found on the control terminal of the transistor 1623 which is turned on, which in turn leads to the transistor 161 being turned on. The voltage Vdd is then equal to the voltage Vsc (from the instant t0 to the instant t1 in FIG. 3) or to Vdd-lim (from the instant t1 to the instant t2 in FIG. 3) depending on the case. In the example shown in FIG. 4, the voltage Vdd-lim is equal to Vref1*(1+(Ra/(Rb+Rc))), with Ra, Rb and Rc the values of the respective resistors 1632, 1633 and 1634. The value of the voltage Vref1 and the values Ra, Rb and Rc are thus determined by the value Vdd-lim.

The circuit 165 thus activates the circuit 163 (instant t2, FIG. 3), i.e., the amplifier 1631. The voltage V2 is equal to Vdd*(Rc/(Ra+Rb+Rc)), the voltage Vref2 being equal to A*Vsc-start.

The values of the resistors Ra, Rb and Rc are chosen so that Rc/(Ra+Rb+Rc)<A, or, in other words, so that Rc/(Ra+Rb+Rc)=A/B with B strictly greater than 1.

The case in which the voltage Vsc is equal to the target value Vsc-start is considered first. The voltage Vdd is thus equal to Vsc-start ignoring the voltage drop in the regulator 16. Indeed, the voltage V2 is equal to Vdd*(Rc/(Ra+Rb+Rc)), thus to Vdd*(A/B). As the voltage Vref2 is equal to A*Vsc-start and the voltage Vdd can at best be equal to the voltage Vsc, the voltage Vref2 is higher than the voltage V2. By choosing B so that the difference between the voltages Vref2 and V2 causes a saturation of the amplifier 1631 at the high-level, for example B equal to 1.25, it is ensured that the transistors 1623 and 161 are turned on. As a result, the voltage Vdd is equal to the target value Vsc-start, ignoring the voltage drop in the transistor 161.

The case (not depicted in FIG. 3) is now considered in which the voltage Vsc increases and departs from the target value Vsc-start, for example due to a defect in the operation of the converter 12. The amplifier 1631 thus provides an output signal such that the voltages V2 and Vref2 are equal. Thus, Vdd*(Rc/(Ra+Rb+Rc)) is equal to A*Vsc-start, or, in other words, the voltage Vdd is equal to B*Vsc-start, B*Vsc-start constituting the threshold value Vdd-start-th. Moreover, when the voltage Vsc becomes higher than the target Vsc-start raised by the hysteresis value of the comparator 141, the output of the latter switches to low, which causes the opening of the switch SW in cases where the switch is not already kept open by the low output of the circuit 142.

The operation of the regulator 16 described above, when the regulator is controlled by its circuit 163, i.e. by the voltage Vref2, rather than by the starting circuit 18, also applies when the target Vsc-start is replaced by a target Vsc-neg, the voltage Vref2 thus being equal to A*Vsc-neg, and the threshold voltage Vdd-th thus being equal to B*Vsc-neg.

Various embodiments and variants have been described. Those skilled in the art will understand that certain features of these embodiments can be combined and other variants will readily occur to those skilled in the art. In particular, the device 10 can be used with other cables of the USB-C type associated with USB-PD technology, for example for adjusting the strength of a power supply source and protecting the device supplied with power by this adjusted power supply.

Finally, the practical implementation of the embodiments and variants described herein is within the capabilities of those skilled in the art based on the functional description provided hereinabove.

The invention claimed is:

1. A device, comprising:
a first terminal configured to receive a DC input voltage from a source circuit;
a switch selectively coupling the first terminal to a second terminal to pass the DC input voltage to a load circuit;
a low-dropout (LDO) linear voltage regulator configured to convert the DC input voltage to a DC supply voltage;
a control circuit powered by the DC supply voltage and configured to control actuation of the switch;
wherein the control circuit operates to negotiate with the load circuit to determine a negotiated level for the DC input voltage supplied by the source circuit and control operation of the source circuit to deliver the DC input voltage at the negotiated level; and
wherein the control circuit further operates to monitor an actual level of the DC input voltage and control the LDO linear voltage regulator such that the DC supply voltage does not increase above a threshold voltage level in response to increase in the actual level of the DC input voltage above the negotiated level.

2. The device according to claim 1, wherein the control circuit includes a hysteresis comparator circuit configured to compare the DC input voltage with the DC supply voltage and control actuation of the switch in response to the comparison.

3. The device according to claim 1, wherein, in response to the DC input increasing from a target value, the LDO linear voltage regulator is configured to maintain the DC supply voltage lower than or equal to a threshold voltage that is higher than the target value.

4. The device according to claim 3, wherein the threshold voltage is determined based on the target value.

5. A device, comprising:
a first terminal configured to receive a DC source voltage from a source circuit;
a low-dropout (LDO) linear voltage regulator configured to convert the DC source voltage to a DC supply voltage;
a control circuit powered by the DC supply voltage and configured to:
negotiate with a load circuit to determine a negotiated level for the DC source voltage supplied by the source circuit and control operation of the source circuit to deliver the DC source voltage at the negotiated level; and
wherein the control circuit further operates to monitor an actual level of the DC source voltage and controls the LDO linear voltage regulator such that the DC supply voltage does not increase above a threshold voltage level in response to increase in the actual level of the DC source voltage above the negotiated level.

6. The device of claim 5, further comprising a switch configured to selectively deliver the DC source voltage to the load circuit.

7. The device according to claim 6, wherein the control circuit is further configured to open the switch when the DC source voltage exceeds a threshold.

8. The device according to claim 5, wherein, in response to the DC input increasing from a target value, the LDO linear voltage regulator is configured to maintain the DC supply voltage lower than or equal to a threshold voltage that is higher than the target value.

9. The device according to claim 5, wherein the threshold voltage is determined based on the target value.

* * * * *